(12) United States Patent
Furukawa et al.

(10) Patent No.: US 6,413,443 B1
(45) Date of Patent: Jul. 2, 2002

(54) PIEZOELECTRIC CERAMIC AND PIEZOELECTRIC DEVICE

(75) Inventors: Masahito Furukawa; Junichi Yamazaki; Yoshiko Gokita, all of Tokyo (JP)

(73) Assignee: TDK Corporation, Tokyo (JP)

( * ) Notice: Subject to any disclaimer, the term of this patent is extended or adjusted under 35 U.S.C. 154(b) by 47 days.

(21) Appl. No.: 09/713,216

(22) Filed: Nov. 16, 2000

(30) Foreign Application Priority Data

Jan. 7, 2000 (JP) .................................. 2000-005954

(51) Int. Cl.$^7$ .................. H01L 41/107; C04B 35/219

(52) U.S. Cl. .................. 252/62.9 PZ; 501/134; 501/135; 501/136

(58) Field of Search ................. 501/134, 136, 501/135; 252/62.9 PZ

(56) References Cited

U.S. PATENT DOCUMENTS 4,062,790 A * 12/1977 Nishida et al. ....... 252/62.9 PZ
6,207,069 B1 * 3/2001 Furukawa et al. .... 252/62.9 PZ

FOREIGN PATENT DOCUMENTS

JP    2957537    7/1999
JP    2957564    7/1999

* cited by examiner

Primary Examiner—C. Melissa Koslow
(74) Attorney, Agent, or Firm—Oliff & Berridge, PLC

(57) ABSTRACT

The piezoelectric ceramic includes oxide represented by $(Pb_{1-a}A_a)_s[Zn_{1/3}Nb_{2/3})_w(Mn_{1/3}B_{2/3})_xTi_yZr_z]O_3$. A represents at least one element in the group comprising Ca, Sr and Ba. B represents at least one element in the group comprising Nb, Sb and Ta and a, s, w, x, y and z are within a range of $0 \leq a \leq 0.1$, $0.9 \leq s < 1.0$, $0.2 \leq w/x \leq 3.0$, $0.1 \leq y \leq 0.5$ and $0.2 \leq z \leq 0.6$, respectively and $w+x+y+z=1$. Therefore, the high mechanical strength can be attained easily and reasonably and also the excellent piezoelectric properties are attained without grinding calcined powder or a hot press.

2 Claims, 3 Drawing Sheets

PIEZOELECTRIC CERAMIC AND PIEZOELECTRIC DEVICE

BACKGROUND OF THE INVENTION

1. Field of the Invention

The present invention relates to a piezoelectric ceramic including oxide consisted of a first element including lead (Pb), a second element including zinc (Zn), niobium (Nb), titanium (Ti) and zirconium (Zr), and oxygen (O) and to a piezoelectric device using the same.

2. Description of the Related Art

Presently, piezoelectric devices utilizing piezoelectric ceramics have been widely used in a wide variety of technical fields. The piezoelectric devices include ultrasonic oscillators, filters, piezoelectric transformers and so on. Of these piezoelectric devices, the piezoelectric transformers recently attract attention. The piezoelectric transformers can be compact, thin and light compared to the conventional electromagnetic transformers. In addition, the piezoelectric transformers have characteristics of high-energy conversion efficiency and less noise.

A typical piezoelectric transformer using a rectangular piezoelectric ceramic plate comprises a primary (input) portion polarized in a direction of thickness and a secondary (output) portion polarized in the lengthwise direction. In the piezoelectric transformer, application of alternating voltage with one wavelength or a half wavelength resonance converts electrical energy to vibrational energy in the low impedance primary portion. The vibrational energy is propagated to the high impedance secondary portion and converted to electrical energy thereby high voltage is generated. In such a piezoelectric transformer, certain intensity, which avoids fracture by impulse and by excitation with large amplitude at high input voltage in a concentration point of stress called a node point, is required. In other words, a high mechanical strength is required for piezoelectric ceramics using for piezoelectric transformers in particular.

The mechanical strength of the piezoelectric transformers closely correlates with defects such as hole. In order to improve the mechanical strength, various studies have been made. For example, grain size diameter of ceramic is made at most 1 μm by calcining raw material powder having a small particle diameter with at least 10 m²/g specific surface area at most a temperature of 650° C. (disclosed in Publication of Unexamined Japanese Patent Application No. Hei 6-112542). The mechanical strength of the piezoelectric transformers can be improved by using a hot press as well.

Principal components of the piezoelectric ceramics are lead titanate, lead titanate zirconate or the like. Also, a second component, a third component or various additives are added to improve the properties of the piezoelectric ceramics. For example, manganese oxide and cobalt oxide are added to zinc niobic lead titanate zirconate (disclosed in Publication of Examined Japanese Patent Application No. Sho 54-18400), or strontium, barium or the like substitute for lead in part (disclosed in Publication of Unexamined Japanese Patent Application No. Sho 62-154682). In addition, niobium oxide, antimony oxide and tantalum oxide are added to the composition mentioned in the Publication of Examined Japanese Patent Application No. Sho 54-18400 to improve the mechanical strength of the piezoelectric transformers (Publication of Japanese Patent No. 2957537).

However, it is difficult to handle the calcined powder in fabricating the piezoelectric ceramics by a method of improving the mechanical strength using the ground-calcined powder. In addition, a step of grinding calcined powder is required. This deteriorates the manufacturing efficiency. In a method using a hot press, it takes longer time to manufacture compared to the usual manufacturing process with no use of hot press and require high cost of equipment. This results in high product price. As a simple and low-cost solution, adjustment of the composition of piezoelectric ceramics is desired to improve the mechanical strength.

SUMMARY OF THE INVENTION

The present invention is designed to overcome the foregoing problems. It is an object of the invention to provide a piezoelectric ceramic capable of improving the mechanical strength simply and at a low cost and a piezoelectric device using the same.

A piezoelectric ceramic of the invention includes oxide consisted of a first element, a second element and oxygen. The first element includes at least lead in the group comprising lead, calcium (Ca), strontium (Sr) and barium (Ba), the composition is represented by the chemical formula 1:

$$Pb_{1-a}A_a \qquad 1$$

wherein A represents at least one element in the group comprising Ca, Sr and Ba, and a is within a range of $0 \leq a \leq 0.1$. The second element includes zinc, manganese (Mn), titanium and zirconium, and at least niobium in the group comprising niobium, antimony (Sb) and tantalum (Ta), the composition of these elements is represented by the chemical formula 2:

$$(Zn_{1/3}Nb_{2/3})_w(Mn_{1/3}B_{2/3})_xTi_yZr_z \qquad 2$$

wherein B represents at least one element in the group comprising Nb, Sb and Ta, and w, x, y and z are within a range of $0.2 \leq w/x \leq 3.0$, $0.1 \leq y \leq 0.5$ and $0.2 \leq z \leq 0.6$, respectively and $w+x+y+z=1$. A composition ratio of the first element to the second element (the first element/the second element) is at least 0.9 and less than 1.0 in the molar ratio.

The piezoelectric ceramic includes oxide having above-mentioned composition. This enables high mechanical strength and excellent piezoelectric properties.

The piezoelectric device of the invention utilizes the piezoelectric ceramic of the invention.

Other and further objects, features and advantages of the invention will appear more fully from the following description.

DETAILED DESCRIPTION OF THE PREFERRED EMBODIMENTS

Figure 1:
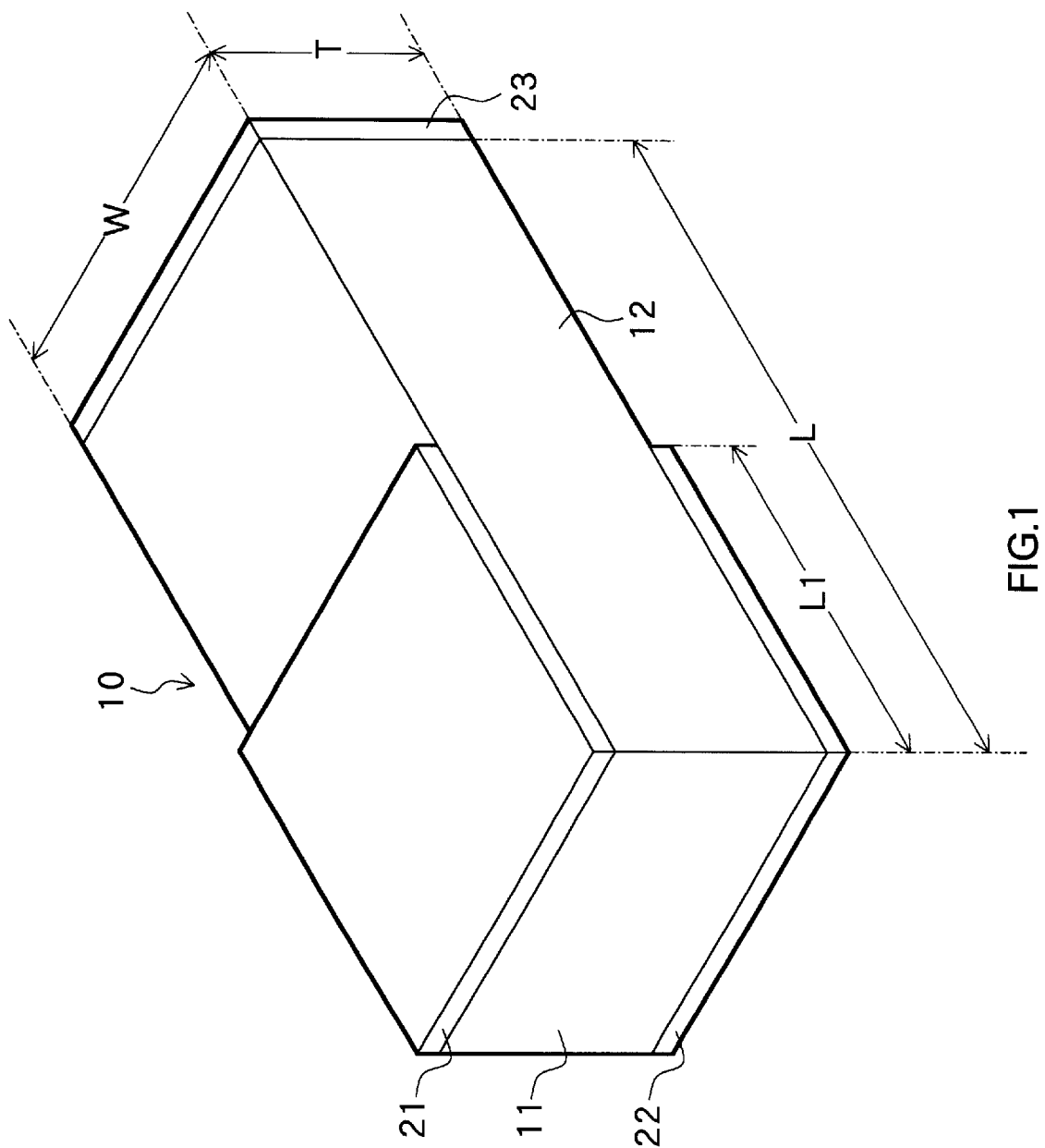
FIG. 1 is a perspective view showing a structure of the piezoelectric transformer according to an embodiment of the invention.

Embodiments of the invention will be described in detail below,

A piezoelectric ceramic according to an embodiment of the invention includes oxide consisted of a first element, a second element and oxygen. The first element includes at least lead in the group comprising lead, calcium, strontium and barium. The second element includes zinc, manganese, titanium and zirconium, and at least niobium in the group comprising niobium, antimony and tantalum. The oxide has the perovskite structure and its composition is represented by the chemical formula 3:

$$(Pb_{1-a}A_a)_s[(Zn_{1/3}Nb_{2/3})_{w}(Mn_{1/3}B_{2/3})_x Ti_y Zr_z]O_3 \quad 3$$

wherein A represents at least one element in the group comprising Ca, Sr and Ba; B represents at least one element in the group comprising Nb, Sb and Ta; and a, s, w, x, y and z are within a range of $0 \leq a \leq 0.1$, $0.9 \leq s < 1.0$, $0.2 \leq w/x \leq 3.0$, $0.1 \leq y \leq 0.5$ and $0.2 \leq z \leq 0.6$, respectively and $w+x+y+z=1$. The composition of oxygen shown in the chemical formula 3 is found stoichiometrically and no need to be the stoichiometric composition.

In other words, the oxide is solid solution, which is lead manganese niobic, lead manganese antimonic acid or lead manganese tantalic acid is dissolved in zinc niobic lead titanate zirconate. Alkaline earth metal element such as calcium, strontium, barium or the like may substitute for lead in part. This enables the piezoelectric ceramic of the invention to achieve high mechanical strength and excellent piezoelectric properties.

In the chemical formula 3, the value of "a", that is, the composition ratio of alkaline earth metal such as calcium or the like substituting for lead in part is at most 0.1 in the molar ratio. If the ratio exceeds 0.1, the piezoelectric properties and the mechanical strength deteriorate. Considering the piezoelectric properties in particular, it is preferable to set the value of "a" within a range of $0 \leq a \leq 0.05$ and more preferably within a range of $0 \leq a \leq 0.02$. This enables to achieve better properties for piezoelectric transformers and ultrasonic motors.

In the chemical formula 3, the value of "s", that is, the composition ratio of a first element is $0.9 \leq s < 1.0$ in the molar ratio. If the ratio is 1.0 or more, the piezoelectric properties and the mechanical strength remarkably deteriorate because of non-sintering. If the ratio is less than 0.9, the piezoelectric properties deteriorate. In order to particularly increase the piezoelectric properties and the mechanical strength, it is preferable to set the value of "s" within a range of $0.90 \leq s \leq 0.99$ and more preferably within a range of $0.93 \leq s \leq 0.97$. The value of "s" in the chemical formula 3 is the composition ratio of a first element in the case where the composition ratio of a second element is 1. This denotes the composition ratio of a first element by the molar ratio to a second element (a first element/a second element).

In the chemical formula 3, the value of "w/x", that is, the composition ratio of $(Zn_{1/3}Nb_{2/3})$ to $(Mn_{1/3}B_{2/3})$ is $0.2 \leq w/x \leq 3.0$ in the molar ratio. If the ratio is less than 0.2, the piezoelectric properties and the mechanical strength deteriorate because of high optimal firing temperature. If the ratio is more than 3.0, the mechanical strength deteriorates. The smaller the value of w/x is, the higher the optimal firing temperature is. Considering a melting point of internal electrode in multilayer piezoelectric devices or manufacturing cost, it is preferable to set the value of "w/x" within a range of $0.333 \leq w/x \leq 3.0$ and more preferably within a range of $0.5 \leq w/x \leq 3.0$. This allows multilayer piezoelectric devices to achieve good properties with low cost without high firing temperature.

In the chemical formula 3, the value of "y", that is, the composition ratio of titanium is $0.1 \leq y \leq 0.5$ in the molar ratio and the value of "z", that is, the composition ratio of zirconium is $0.2 \leq z \leq 0.6$ in the molar ratio. This allows good piezoelectric properties.

In blending at least two kinds of elements with A or B in the chemical formula 3, the composition ratio of the elements is discretionary. The composition shown in the chemical formula 3 is found stoichiometrically by the amount of metal in blending raw material, for example.

The piezoelectric ceramic is composed of a plurality of particles. The average diameter of the particles is in the order of 0.2 to 10 μm, for instance.

The piezoelectric ceramic having such a structure is manufactured as follows, for example.

First, oxide including a first element and a second element is prepared as a starting material and these elements are mixed depending on the desired composition. Carbonate or oxalate, which becomes oxide by firing, may be used for the raw material of alkaline earth metal element or manganese instead of oxide. The materials become oxide by firing may be used for other elements as well. The mixture is calcined for about two hours at a temperature of, for example, 800 to 900° C. and then the calcined product is grained. Subsequently, binder is added to the calcined powder and applied compression molding with a pressure of, for example, about $5 \times 10^8$ Pa. After that, the mold is fired for about two hours at a temperature of, for example, about 1000 to about 1200° C. in the atmosphere. Thereby, the piezoelectric ceramic of the embodiment is obtained.

The piezoelectric ceramic is preferably used for a material of piezoelectric devices such as piezoelectric transformers and ultrasonic motors, which greatly oscillate and require high mechanical strength. Specific description will be made with taking a piezoelectric transformer for an example.

FIG. 1 illustrates a structure of a piezoelectric transformer using the piezoelectric ceramic according to the embodiment. The piezoelectric transformer is so-called "Rosen-type" and comprises a body 10 having, for example, rectangular single plate construction. The body 10 is made by the piezoelectric ceramic of the embodiment. The body 10 has the longitudinal length L in the order of 15 to 40 mm, the width W in the order of 3 to 7 mm and the thickness T in the order of 0.7 to 1.5 mm. The piezoelectric transformer uses the piezoelectric ceramic of the embodiment. As a result, sufficient mechanical strength is attained even if the thickness T of the body 10 is 2 mm or less. Remarkable effect is especially attained with the thickness T of 0.05 to 1 mm.

The body 10 has a primary portion 11 provided one side in the lengthwise direction and a secondary portion 12 provided the other side in the lengthwise direction. The primary portion 11 is polarized in a direction of thickness and the secondary portion 12 is polarized in the lengthwise direction. The length L1 of the primary portion 11 is about 7 to about 20 mm, for instance. A pair of input electrodes 21 and 22 are respectively provided on the both surfaces facing each other in the direction of thickness of the primary portion 11. An output electrode 23 is provided on an end face of the secondary portion 12 in the lengthwise direction. The input electrodes 21 and 22 and the output electrode 23 are made by conductor such as silver (Ag) and have a thickness in the order of 1 to 20 μm.

In the piezoelectric transformer with such a construction, application of alternating voltage with one wavelength or a half wavelength resonance to the primary portion 11 through the input electrodes 21 and 22 converts electrical energy to vibrational energy in the primary portion 11 having a low impedance property. The vibrational energy is propagated to the secondary portion 12 having a high impedance property and then converted to electrical energy. Therefore high voltage in the order of 5- to 15-times of input voltage can be obtained. The body 10 is made by the piezoelectric ceramic of the embodiment, so that the body 10 has enough mechanical strength. This enables oscillation in large amplitude and to obtain high voltage because of the high input voltage.

Such a piezoelectric transformer can be fabricated in the usual method. For example, first, after the piezoelectric ceramic is fabricated as described above, the piezoelectric ceramic is processed in predetermined size to form the body 10. Then, the input electrodes 21 and 22 and the output electrode 23 are respectively formed in the body 10, for instance. Subsequently, the primary portion 11 and the secondary portion 12 are polarized. Thereby, the piezoelectric transformer shown in FIG. 1 can be obtained.

Figure 2:
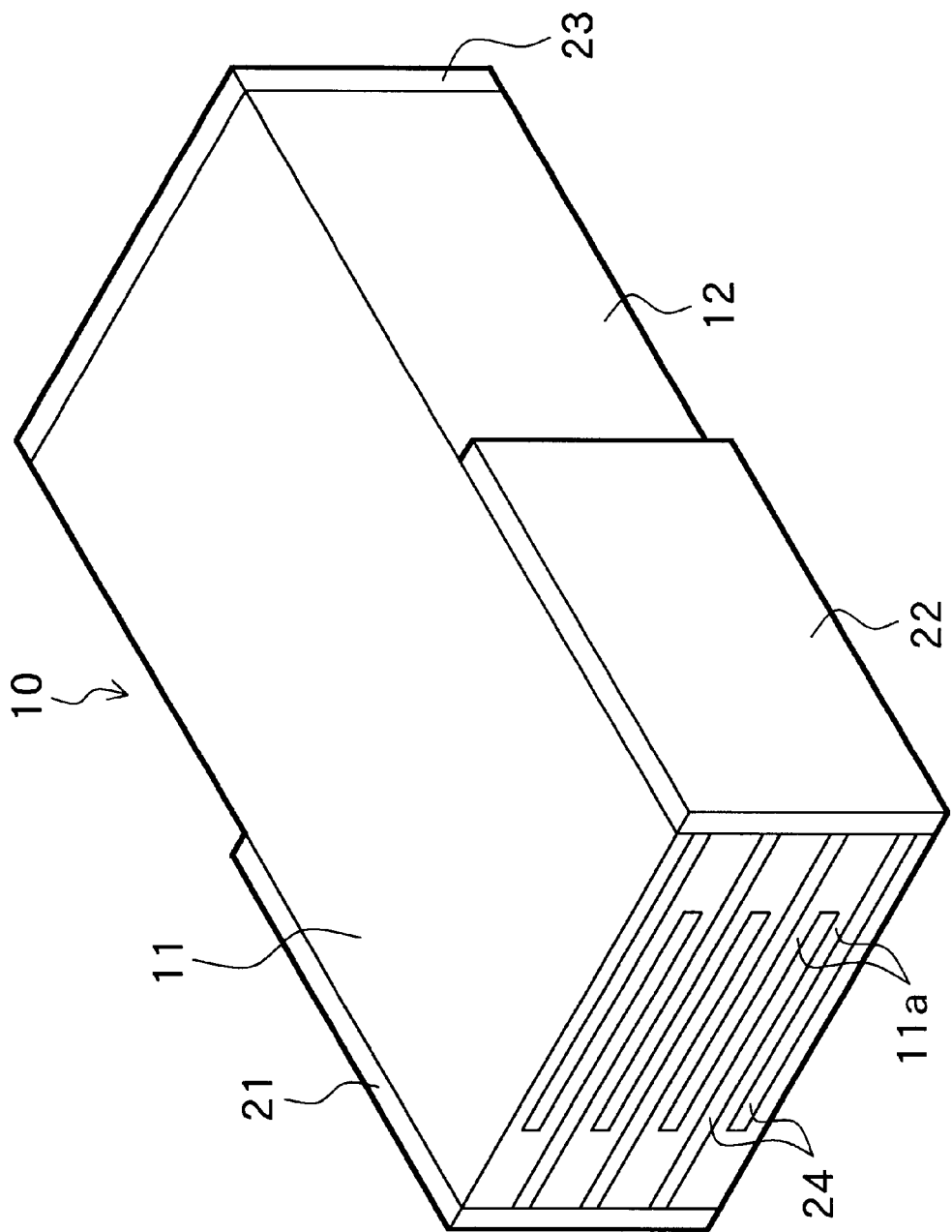
FIG. 2 is a perspective view showing a structure of other piezoelectric transformer of the invention.

In the above-mentioned piezoelectric transformer, the body 10 has a single plate construction of piezoelectric ceramic. However, the primary portion 11 of the body 10 may have a stacked structure as shown in FIG. 2, for instance. In FIG. 2, the components corresponding to the piezoelectric transformer of FIG. 1 are identified with the same numerals.

The primary portion 11 of the body 10 has a structure that piezoelectric ceramic layers 11a and internal electrodes 24 are alternately stacked. The internal electrodes 24 are alternately extended to the facing direction and respectively connected to a pair of input electrodes 21 and 22 provided on the sides facing in the width direction. The other constructions are the same as the piezoelectric transformer of FIG. 1. The piezoelectric transformer of FIG. 2 has such a multilayer structure. This enables high magnification of transformation in voltage compared to the single plate construction shown in FIG. 1.

The piezoelectric transformer is fabricated as follows. For example, first, raw material powder of the piezoelectric ceramic are mixed and calcined and then ground. After that, binder is added to mold the resultant mixture in sheet and then printed to the internal electrode 24. Then, a plurality of resultant mixture printed to the electrodes 24 are stacked and fired to form the body 10. As described above, the input electrodes 21 and 22 and the output electrode 23 are respectively formed and polarized. Thereby, the piezoelectric transformer shown in FIG. 2 can be obtained.

As described, according to the embodiment, the piezoelectric ceramic includes oxide consisted of a first element, a second element and oxygen. The first element includes at least lead in the group comprising lead, calcium, strontium and barium. The second element includes zinc, manganese, titanium and zirconium, and at least niobium in the group comprising niobium, antimony and tantalum. The above-mentioned chemical formula 3 represents the composition of the oxide. Consequently, the high mechanical strength can be improved easily and reasonably and also the excellent piezoelectric properties are attained without grinding calcined powder or a hot press.

Accordingly, the piezoelectric devices utilizing the piezoelectric ceramic of the embodiment can prevent fracture caused by oscillation in large amplitude or externally applied impulse. This enables to improve quality and reliability of the devices. The performance of the piezoelectric devices such as piezoelectric transformers or ultrasonic motors with large operation load can be especially improved.

Further specific examples of the invention will be described.

EXAMPLE 1–18

First, lead oxide (PbO) powder, zinc oxide (ZnO) powder, niobium oxide ($Nb_2O_5$) powder, manganese carbonate ($MnCO_3$) powder, titanium oxide ($TiO_2$) powder, zirconium oxide ($ZrO_2$) powder, antimony oxide ($Sb_2O_3$) power and tantalum oxide ($Ta_2O_5$) powder are prepared as starting materials. These raw material powder are blended to be the ratio of metal element forms the composition of the chemical formula 4:

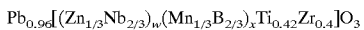

$$Pb_{0.96}[(Zn_{1/3}Nb_{2/3})_w(Mn_{1/3}B_{2/3})_xTi_{0.42}Zr_{0.4}]O_3 \quad 4$$

and wet-blended by use of a ball mill. In other words, the values of a is 0, s is 0.96, y is 0.42 and z is 0.4 in the above-mentioned chemical formula 3 and the element B and the values of w and x are respectively changed in the examples 1 to 18 as shown in Table 1.

TABLE 1

|  | B | w | x | w/x | Flexural strength Mpa | Conversion efficiency % |
|---|---|---|---|---|---|---|
| Example 1 | Ta | 0.135 | 0.045 | 3 | 120.1 | 94.7 |
| Example 2 | Ta | 0.12 | 0.06 | 2 | 127.7 | 95.0 |
| Example 3 | Ta | 0.09 | 0.09 | 1 | 137.3 | 94.9 |
| Example 4 | Ta | 0.06 | 0.12 | 0.5 | 123.9 | 93.5 |
| Example 5 | Ta | 0.045 | 0.135 | 0.333 | 125.8 | 93.1 |
| Example 6 | Ta | 0.03 | 0.15 | 0.2 | 121.0 | 93.0 |
| Example 7 | Sb | 0.135 | 0.045 | 3 | 117.2 | 92.8 |
| Example 8 | Sb | 0.12 | 0.06 | 2 | 135.4 | 93.2 |
| Example 9 | Sb | 0.09 | 0.09 | 1 | 131.6 | 93.6 |
| Example 10 | Sb | 0.06 | 0.12 | 0.5 | 122.0 | 93.0 |
| Example 11 | Sb | 0.045 | 0.135 | 0.333 | 118.1 | 93.0 |
| Example 12 | Sb | 0.03 | 0.15 | 0.2 | 115.2 | 92.9 |
| Example 13 | Nb | 0.135 | 0.045 | 3 | 121.0 | 92.8 |
| Example 14 | Nb | 0.12 | 0.06 | 2 | 132.5 | 93.1 |
| Example 15 | Nb | 0.09 | 0.09 | 1 | 135.4 | 94.3 |
| Example 16 | Nb | 0.06 | 0.12 | 0.5 | 123.9 | 93.7 |
| Example 17 | Nb | 0.045 | 0.135 | 0.333 | 117.2 | 93.8 |
| Example 18 | Nb | 0.03 | 0.15 | 0.2 | 120.1 | 93.3 |

After calcining the resultant mixture for about two hours at a temperature of about 850° C., the resultant mixture is wet-milled with a ball mill. After that, water as binder is added to the resultant powder and powder is compression-molded at a pressure of about $5 \times 10^8$ Pa into a 50-by-50 mm plate. Subsequently, the mold is fired for about two hours at a temperature of about 1100° C. in the atmosphere. Thereby, the piezoelectric ceramics of the examples 1 to 18 are obtained. The examples 1 to 18 have the same conditions except that the element B, the values w and x in the above-mentioned chemical formula 4 differ in blending raw material powder.

In the comparisons 1 to 7 for the examples 1 to 18, each piezoelectric ceramic is fabricated like the examples 1 to 18 except that the element B, and the values w and x in the above-mentioned chemical formula 4 in blending raw material powder are changed as shown in Table 2.

TABLE 2

|  | B | w | x | w/x | Flexural strength Mpa | Conversion efficiency % |
|---|---|---|---|---|---|---|
| Comparison 1 | — | 0.18 | 0 | — | 62.4 | 87.2 |
| Comparison 2 | Ta | 0.15 | 0.03 | 5 | 68.2 | 73.3 |
| Comparison 3 | Ta | 0 | 0.18 | 0 | 70.1 | 81.2 |
| Comparison 4 | Sb | 0.15 | 0.03 | 5 | 70.1 | 78.4 |
| Comparison 5 | Sb | 0 | 0.18 | 0 | 82.6 | 76.6 |
| Comparison 6 | Nb | 0.15 | 0.03 | 5 | 73.0 | 75.7 |
| Comparison 7 | Nb | 0 | 0.18 | 0 | 78.8 | 80.5 |
| Reference | — | — | — | — | 108.5 | 92.5 |

The density of the piezoelectric ceramics obtained in the examples 1 to 18 and the comparisons 1 to 7 are measured. As a result, each piezoelectric ceramic attains at least 95 % of the theoretical density.

The strength test is carried out with a three point bending strength on the piezoelectric ceramics of the examples 1 to 18 and the comparisons 1 to 7. The sizes of test samples are 2 mm long, 4 mm wide and 0.9 mm thick and the test samples are measured the flexural strength according to JIS (R1601). The results are shown in Tables 1 and 2.

The piezoelectric transformers are fabricated as shown in FIG. 1 by use of the piezoelectric ceramics of the examples 1 to 18 and the comparisons 1 to 7. Specifically, after processing the piezoelectric ceramics in 32 mm in length L, 4.5 mm in width W and 1 mm in thickness T, the input electrodes 21 and 22 and the output electrodes 23 are formed. Subsequently, the primary portion 11 and then the secondary portion 12 are polarized for half an hour in the silicon oil of a temperature of 120° C. with electric field of 2 kV/mm and the piezoelectric transformers are fabricated. The length L1 of the primary portion 11 is 16 mm.

Figure 3:
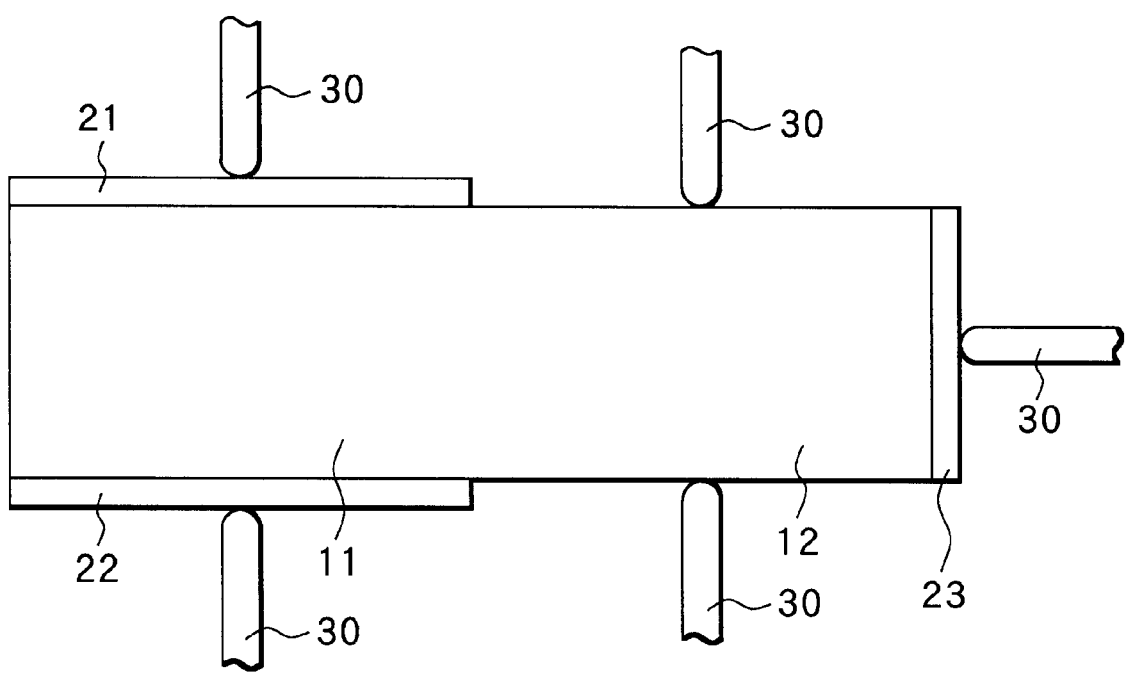
FIG. 3 is a view for describing a measuring method of energy conversion efficiency of the piezoelectric transformer according to the embodiment of the invention.

As shown in FIG. 3, input and output are performed by retaining no vibrational points called node points and the output electrodes 23 by contact probes 30 in the piezoelectric transformers of the examples 1 to 18 and the comparisons 1 to 7. The energy conversion efficiency, which is one of the piezoelectric properties, is measured. The results are also shown in Tables 1 and 2.

In Table 2, the flexural strength of one example of the piezoelectric ceramic disclosed in Publication of Japanese Patent No. 2957537 and the energy conversion efficiency of the piezoelectric transformer fabricated by use of the piezoelectric ceramic are shown as a reference. Manganese oxide of 1.0 % and niobium oxide of 0.5 % are added to zinc niobic lead titanate zirconate having the composition of the formula 5:

$$Pb\,[(Zn_{1/3}Nb_{2/3})_{0.20}Ti_{0.4}Zr_{0.4}]O_3 \quad\quad 5$$

in the piezoelectric ceramic of the reference shown in Table 2.

As can be seen from Tables 1 and 2, according to the examples 1 to 18, high flexural strength and energy conversion efficiency can be attained compared to the comparisons 1 to 7 and the reference. In other words, if the composition ratio w/x of $(Zn_{1/3}Nb_{2/3})$ to $(Mn_{1/3}B_{2/3})$ is within a range of $0.2 \leq w/x \leq 3.0$ in the molar ratio, the mechanical strength can be improved and the excellent piezoelectric properties are attained.

EXAMPLES 19 to 25

The piezoelectric ceramics are fabricated like the examples 1 to 18 except that the raw material powder is blended to be the ratio of metal element forms the composition of the chemical formula 6:

$$Pb_s[(Zn_{1/3}Nb_{2/3})_{0.09}(Mn_{1/3}Ta_{2/3})_{0.09}Ti_{0.42}Zr_{0.4}]O_3 \quad\quad 6$$

and the values s in the chemical formula 6 is changed in the examples 19 to 20 as shown in Table 3. In other words, the value of a is 0, the element B is tantalum, each value of w and x is 0.09, the value w/x is 1, y is 0.42 and z is 0.4 in the above-mentioned chemical formula 3 and the values of s are respectively changed in the examples 19 to 25.

TABLE 3

|  | s | Flexural strength Mpa | Conversion efficiency % |
|---|---|---|---|
| Example 19 | 0.995 | 114.7 | 92.9 |
| Example 20 | 0.99 | 120.5 | 93.2 |
| Example 21 | 0.98 | 119.6 | 93.0 |

TABLE 3-continued

|  | s | Flexural strength Mpa | Conversion efficiency % |
|---|---|---|---|
| Example 22 | 0.97 | 135.2 | 93.7 |
| Example 23 | 0.96 | 140.1 | 94.9 |
| Example 24 | 0.93 | 133.3 | 94.0 |
| Example 25 | 0.90 | 118.6 | 93.3 |
| Comparison 8 | 1.01 | 69.6 | 63.9 |
| Comparison 9 | 1.00 | 77.4 | 71.6 |
| Comparison 10 | 0.85 | 108.8 | 91.1 |

In the comparisons 8 to 10 for the examples 19 to 25, the piezoelectric ceramics are fabricated like the examples 19 to 25 except that the values s in the above-mentioned chemical formula 6 are changed as shown in Table 3 in blending raw material powder.

For the piezoelectric ceramics of the examples 19 to 25 and the comparisons 8 to 10, the densities of the piezoelectric ceramics are measured and the strength tests are carried out like the examples 1 to 18. In addition, after fabricating the piezoelectric transformers by utilizing the piezoelectric ceramics, the energy conversion efficiency is measured. As a result, each piezoelectric ceramic attains at least 95 % of the theoretical density. The results of the strength tests and the energy conversion efficiency are shown in Table 3.

As can be seen from Table 3, according to the examples 19 to 25, a high flexural strength and energy conversion efficiency can be attained compared to the comparisons 8 to 10 and the reference shown in Table 2. Namely, if the composition ratio of a first element to a second element is within a range of $0.9 \leq s < 1.0$ in the molar ratio, the mechanical strength can be improved and the excellent piezoelectric properties are attained. The composition ratio within a range of $0.90 \leq s \leq 0.99$ attains higher mechanical strength and the composition ratio within a range of $0.93 \leq s \leq 0.97$ attains further higher mechanical strength.

EXAMPLES 26 to 37

As starting materials, calcium carbonate ($CaCO_3$) powder, strontium carbonate ($SrCO_3$) powder and barium carbonate ($BaCO_3$) powder are further prepared. These raw materials are blended to be the ratio of metal element forms the composition of the chemical formula 7:

$$(Pb_{1-a}A_a)_{0.96}[(Zn_{1/3}Nb_{2/3})_{0.09}(Mn_{1/3}Ta_{2/3})_{0.09}Ti_{0.42}Zr_{0.4}]O_3 \quad\quad 7.$$

The piezoelectric ceramics are fabricated like the examples 1 to 18 except that the element A and the value of a in the chemical formula 7 are changed as shown in the examples 26 to 37 in Table 4. In other words, in the examples 26 to 37, the value of s is 0.96, the element B is tantalum, each value of w and x is 0.09, the values of w/x is 1, y is 0.42 and z is 0.4 in the above-mentioned chemical formula 3 and the element A and the value of a are respectively changed.

TABLE 4

|  | A | a | Flexural strength Mpa | Conversion efficiency % |
|---|---|---|---|---|
| Example 26 | Ca | 0.01 | 136.2 | 94.3 |
| Example 27 | Ca | 0.02 | 142.1 | 94.5 |
| Example 28 | Ca | 0.05 | 130.3 | 93.7 |
| Example 29 | Ca | 0.1 | 116.6 | 92.9 |

TABLE 4-continued

| | A | a | Flexural strength Mpa | Conversion efficiency % |
|---|---|---|---|---|
| Example 30 | Sr | 0.01 | 125.4 | 93.2 |
| Example 31 | Sr | 0.02 | 124.5 | 94.1 |
| Example 32 | Sr | 0.05 | 129.4 | 93.7 |
| Example 33 | Sr | 0.1 | 108.8 | 92.6 |
| Example 34 | Ba | 0.01 | 136.2 | 94.0 |
| Example 35 | Ba | 0.02 | 119.6 | 94.0 |
| Example 36 | Ba | 0.05 | 128.4 | 93.3 |
| Example 37 | Ba | 0.1 | 111.7 | 92.8 |
| Example 3 | — | — | 137.3 | 94.9 |
| Comparison 11 | Ca | 0.2 | 97.0 | 90.4 |
| Comparison 12 | Sr | 0.2 | 98.0 | 91.3 |
| Comparison 13 | Ba | 0.2 | 90.2 | 92.2 |

In the comparisons 11 to 13 for the examples 26 to 37, the piezoelectric ceramics are fabricated like the examples 26 to 37 except that the element A and the value of a in the above-mentioned chemical formula 7 are changed as shown in Table 4 in blending raw material powder.

For the piezoelectric ceramics of the examples 26 to 37 and the comparisons 11 to 13, the densities of the piezoelectric ceramics are measured and the strength tests are carried out like the examples 1 to 18. In addition, after fabricating the piezoelectric transformers by utilizing the piezoelectric ceramics, the energy conversion efficiency is measured. As a result, each piezoelectric ceramic attains at least 95% of the theoretical density. The results of the strength tests and the energy conversion efficiency are shown in Table 4. In Table 4, the flexural strength and the energy conversion efficiency of the example 3 corresponding to the case where the value of a in the above-mentioned chemical formula 7 is 0 is also shown.

As can be seen from Table 4, according to the examples 26 to 37, a high flexural strength and energy conversion efficiency can be attained compared to the comparisons 11 to 13 and the reference shown in Table 2. In other words, if the composition ratio a of alkaline earth metal substituting for lead in part is within a range of $0 \leq a \leq 0.1$ in the molar ratio, the mechanical strength can be improved and the excellent piezoelectric properties are attained. The composition ratio within a range of $0 \leq a \leq 0.05$ attains higher mechanical strength and the piezoelectric properties, and the composition ratio within a range of $0 \leq a \leq 0.02$ attains further higher piezoelectric properties.

In the above-mentioned embodiments, the description is made with some specific examples. The other piezoelectric ceramics can attain the same result as the above-mentioned embodiments with oxide describing in the above-mentioned embodiments included.

Although the present invention has been described by some embodiments and examples, the invention is not limited to the foregoing embodiments and examples but can be variously modified. For example, although in the above-mentioned embodiments and examples, oxide has the composition shown in the chemical formula 3, a first element may include other elements than lead, calcium, strontium and barium and a second element may include other elements than zinc, manganese, titanium, zirconium, niobium, antimony and tantalum. In this case, the first element includes at least lead in the group comprising lead, calcium, strontium and barium, and the composition is represented by the chemical formula 1. The second element includes zinc, manganese, titanium and zirconium, and at least niobium in the group comprising niobium, antimony and tantalum, and the composition of these elements is preferably represented by the chemical formula 2 because the excellent piezoelectric properties are attained within the range, as described above.

Although the piezoelectric ceramic is utilized for the piezoelectric transformer in the above-mentioned embodiments and examples, it can be widely used for the other piezoelectric devices such as ultrasonic oscillators, filters or the like. It is preferable to use for the piezoelectric devices with large operation load since the outstanding effects can be obtained. It is also used for the piezoelectric devices requiring low mechanical strength.

As described, according to the piezoelectric ceramic of the invention, oxide consisted of a first element, a second element and oxygen is included. The first element includes at least lead in the group comprising lead, calcium, strontium and barium and the composition is represented by the chemical formula 1. The second element includes zinc, manganese, titanium and zirconium, and at least niobium in the group comprising niobium, antimony and tantalum and the composition of these elements is represented by the chemical formula 2. The composition ratio of the first element to the second element is at least 0.9 and less than 0.1 in the molar ratio. As a result, the high mechanical strength can be improved easily and reasonably and also the excellent piezoelectric properties are attained without grinding calcined powder or a hot press.

According to the piezoelectric device of the invention, the piezoelectric ceramic of the invention is utilized. It can prevent fracture caused by oscillation in large amplitude or externally applied impulse. This enables to improve quality and reliability of the device. The performance of the piezoelectric devices such as piezoelectric transformers or ultrasonic motors with large operation load can be improved in particular.

Obviously many modifications and variations of the present invention are possible in the light of the above teachings. It is therefore to be understood that within the scope of the appended claims the invention may be practiced otherwise than as specifically described.

What is claimed is:
1. A piezoelectric ceramic including oxide consisted of a first element, a second element and oxygen, wherein:
the first element includes at least lead in the group comprising lead (Pb), calcium (Ca), strontium (Sr) and barium (Ba), the composition is represented by the chemical formula:

wherein A represents at least one element in the group comprising Ca, Sr and Ba, and a is within a range of $0 \leq a \leq 0.1$;
the second element includes zinc (Zn), manganese (Mn), titanium (Ti) and zirconium (Zr), and at least niobium in the group comprising niobium (Nb), antimony (Sb) and tantalum (Ta), the composition of these elements is represented by the chemical formula:

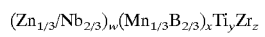

wherein B represents at least one element in the group comprising Nb, Sb and Ta, and w, x, y and z are within a range of $0.2 \leq w/x \leq 3.0$, $0.1 \leq y \leq 0.5$ and $0.2 \leq z \leq 0.6$, respectively and $w+x+y+z=1$; and
the composition ratio of the first element to the second element (the first element/the second element) is at least 0.9 and less than 1.0 in the molar ratio.
2. A piezoelectric device utilizing the piezoelectric ceramic according to claim 1.

* * * * *